(12) United States Patent
Berkhout

(10) Patent No.: US 7,961,043 B2
(45) Date of Patent: Jun. 14, 2011

(54) SINGLE-ENDED AMPLIFIER

(75) Inventor: Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 120 days.

(21) Appl. No.: 12/160,379

(22) PCT Filed: Jan. 5, 2007

(86) PCT No.: PCT/IB2007/050037
§ 371 (c)(1),
(2), (4) Date: Jul. 9, 2008

(87) PCT Pub. No.: WO2007/080528
PCT Pub. Date: Jul. 19, 2007

(65) Prior Publication Data
US 2008/0309404 A1 Dec. 18, 2008

(30) Foreign Application Priority Data
Jan. 9, 2006 (EP) .................................. 06100150

(51) Int. Cl.
*H03F 1/36* (2006.01)
(52) U.S. Cl. ....................................................... 330/103

(58) Field of Classification Search .................... 330/69, 330/102–104, 107, 109, 260, 282; 381/59, 381/96, 121
See application file for complete search history.

(56) References Cited

U.S. PATENT DOCUMENTS

| 4,539,529 A | 9/1985 | Lenz |
| 5,197,102 A * | 3/1993 | Sondermeyer ................. 381/59 |
| 5,625,698 A * | 4/1997 | Barbetta ........................ 381/96 |
| 7,053,705 B2 * | 5/2006 | Hench et al. .................. 330/102 |
| 7,456,685 B2 * | 11/2008 | Chen, Wei ...................... 330/10 |
| 2003/0179892 A1 | 9/2003 | Madsen |

FOREIGN PATENT DOCUMENTS

| WO | 9921273 A | 4/1999 |
| WO | 0021192 A | 4/2000 |

* cited by examiner

*Primary Examiner* — Khanh V Nguyen

(57) ABSTRACT

In an amplifier arrangement comprising an amplifier ($A_O$) having an output, a first feedback ($R_{fb}$) between the output and an input side of the amplifier, a load ($R_L$) having a first terminal coupled to the output and a second terminal, and a DC-blocking capacitance ($C_{DC}$) between the second terminal of the load and a reference terminal, a second feedback ($C_x$, $R_x$) is present between the second terminal of the load and the input side of the amplifier.

7 Claims, 2 Drawing Sheets

SINGLE-ENDED AMPLIFIER

FIELD OF THE INVENTION

The invention relates to a single-ended amplifier, and in particular to a feedback configuration for single-ended amplifiers with asymmetrical supply.

BACKGROUND OF THE INVENTION

In many audio amplifiers a so-called single-ended configuration is used. In a single-ended configuration only one terminal of the loudspeaker load is connected to the output of the power amplifier. If a symmetrical power supply is available the other loudspeaker terminal is connected to ground. If only a single (asymmetrical) power supply is available a DC-blocking capacitor is needed between the loudspeaker and ground. The average voltage across the DC-blocking capacitor equals half the supply voltage. The amplifier may have a feedback loop between the output and an inverting input of the amplifier.

SUMMARY OF THE INVENTION

It is, inter alia, an object of the invention to provide an improved amplifier. The invention is defined in the independent claims. Advantageous embodiments are defined in the dependent claims.

The invention provides an amplifier arrangement comprising an amplifier having an output, a first feedback between the output and an input side of the amplifier, a load having a first terminal coupled to the output and a second terminal, and a DC-blocking capacitance between the second terminal of the load and a reference terminal, in which a second feedback is present between the second terminal of the load and the input side of the amplifier.

The invention is based on the recognition that in the prior art, the feedback loop does not correct for errors that appear across the DC-blocking capacitor. In accordance with the present invention, feedback from both load terminals is applied.

An embodiment provides a feedback configuration that allows multiple single-ended class-D amplifiers to operate on a single supply voltage using one common DC-blocking capacitor while still maintaining good channel separation. The invention can be applied in (integrated) audio amplifiers.

These and other aspects of the invention will be apparent from and elucidated with reference to the embodiments described hereinafter.

DETAILED DESCRIPTION OF EMBODIMENTS

Figure 1:
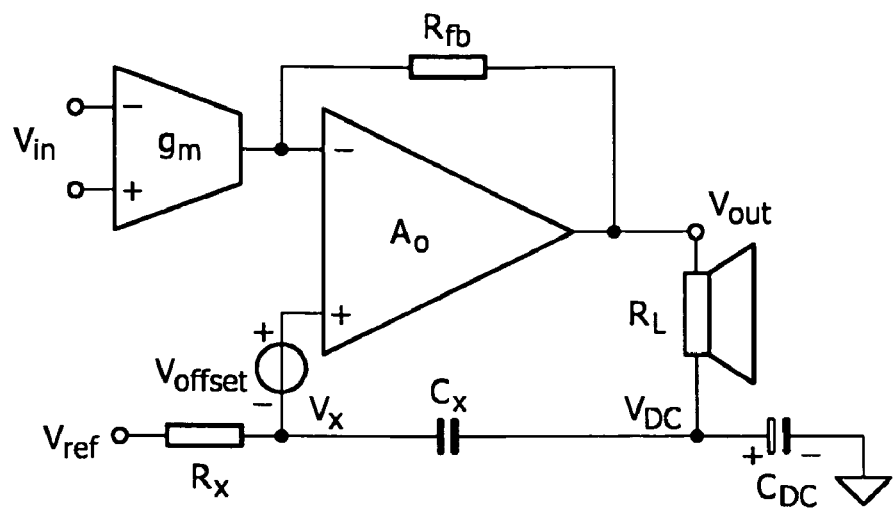
FIG. 1 shows a feedback configuration according to a first embodiment of the invention.

In the embodiment of FIG. 1, an input voltage $V_{in}$ is applied to a cascade of a VI-converter $g_m$ followed by a transimpedance power amplifier. The transimpedance stage is realized with an operational amplifier $A_o$. At the inverting input of the operational amplifier $A_o$ a virtual ground is created by means of feedback from the output node $V_{out}$ through feedback resistor $R_{fb}$. At the non-inverting input of operational amplifier $A_o$, $V_{offset}$ indicates an inevitable small but nonzero offset voltage. At the non-inverting input, a reference voltage $V_{ref}$ is applied thru a resistor $R_x$. The reference voltage $V_{ref}$ defines the DC-level of both the virtual ground and the output node. A loudspeaker $R_L$ and a DC-blocking capacitor $C_{DC}$ are connected in series between the output node of the amplifier $A_o$ and ground. A capacitor $C_x$ is connected between the terminal $V_x$ of the resistor $R_x$ that is connected the non-inverting input of operational amplifier $A_o$ on the one hand, and on the other hand to the connection point $V_{DC}$ of the loudspeaker $R_L$ and the DC-blocking capacitor $C_{DC}$. In the shown asymmetrical supply configuration, the DC-blocking capacitor $C_{DC}$ will match the DC-level of the amplifier output. The reference voltage $V_{ref}$ is chosen equal to half the supply voltage to maximize the (symmetrical) AC voltage swing of the output node.

The capacitor $C_x$ and resistor $R_x$ form a high-pass filter having a transfer approaching unity (0 dB) for frequencies higher than the cut-off frequency $f_c$ and zero at DC. The cut-off frequency $f_c$ is given by $f_c=1/(2\pi R_x C_x)$. Consequently, for frequencies higher than the cut-off frequency $f_c$ the configuration behaves as a direct feedback from the point $V_{DC}$ to the non-inverting input of the operational amplifier $A_o$.

For DC the feedback capacitor $C_x$ blocks the feedback and thus eliminates a problem of output voltage drift caused by offset as follows: without the feedback capacitor $C_x$, the feedback loop would cause the offset voltage $V_{offset}$ to appear across the loudspeaker $R_L$ causing a small but nonzero DC-current through the loudspeaker, which current would also have to flow through the DC-blocking capacitor $C_{DC}$ thereby causing the output voltage to drift away until ground or the supply voltage limits it. With the feedback capacitor $C_x$, the offset voltage $V_{offset}$ appears across the feedback capacitor $C_x$, and no longer causes a DC current to flow through the loudspeaker $R_L$ and the DC blocking capacitor $C_{DC}$, so that the output voltage no longer drifts.

Advantageously, feedback from both loudspeaker terminals is present for AC signals improving distortion and channel separation, while for DC the second feedback is not present eliminating the problem of output voltage drift caused by offset.

Figure 2:
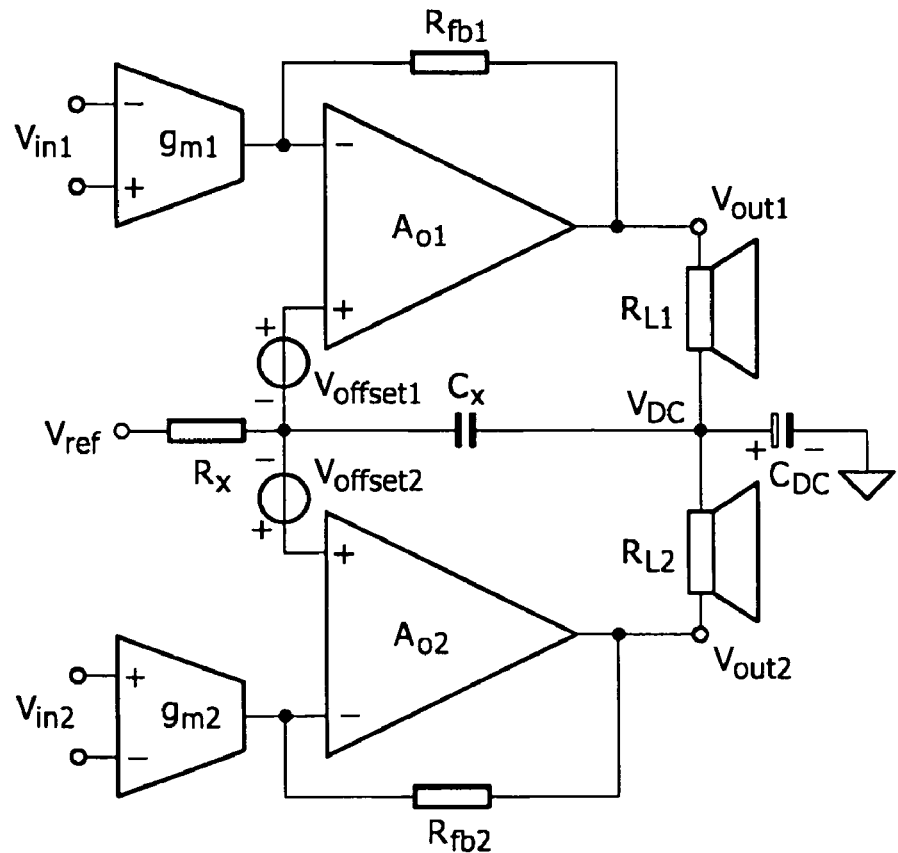
FIG. 2 shows a stereo configuration according to a second embodiment of the invention.

In FIG. 2, a stereo configuration is shown. Basically, the circuit of FIG. 1 is doubled (one copy having reference signs ending with "1", the other copy having reference signs ending with "2") with the resistor $R_x$, the capacitor $C_x$, and the DC-blocking capacitor $C_{DC}$ in common. The possibility to share the DC-blocking capacitor $C_{DC}$ is very cost-effective. In general the offset voltage of the two operational amplifiers $A_{o1}$ and $A_{o2}$ are not equal. The DC-voltage across the feedback capacitor $C_x$ is now equal to the average value of the offset voltages $V_{offset1}$ and $V_{offset2}$. The voltage across the loudspeaker in channel 1 becomes $(V_{offset1}-V_{offset2})/2$ and the voltage across the loudspeaker of channel 2 becomes $(V_{offset2}-V_{offset1})/2$ which is exactly opposite to channel 1. Consequently the DC offset currents through the loudspeakers cancel and no voltage drift occurs at the DC-blocking capacitor $C_{DC}$. This idea can be extended to more channels.

The implementation of the invention may be as simple as shown in FIGS. 1 and 2, i.e. a feedback from the loudspeaker terminal $V_{DC}$ that is not connected to the output of the operation amplifier $A_o$ by means of one resistor $R_x$ and one capacitor $C_x$. Practical values for $R_x$ lie in the range 10 kΩ-100 kΩ and for $C_x$ in the range 100 nF-1 μF.

In stereo signals, the low frequency content is often in-phase. This can be exploited in the configuration shown in FIG. 2 by inverting the phase of one channel and reversing the polarity of the loudspeaker of that channel. Now the signal currents of the low frequency channels cancel which means no low frequency current is supplied by the DC-blocking capacitor $C_{DC}$ and the voltage $V_{DC}$ stay at half the supply voltage. This allows full power output at low frequencies.

Figure 3:
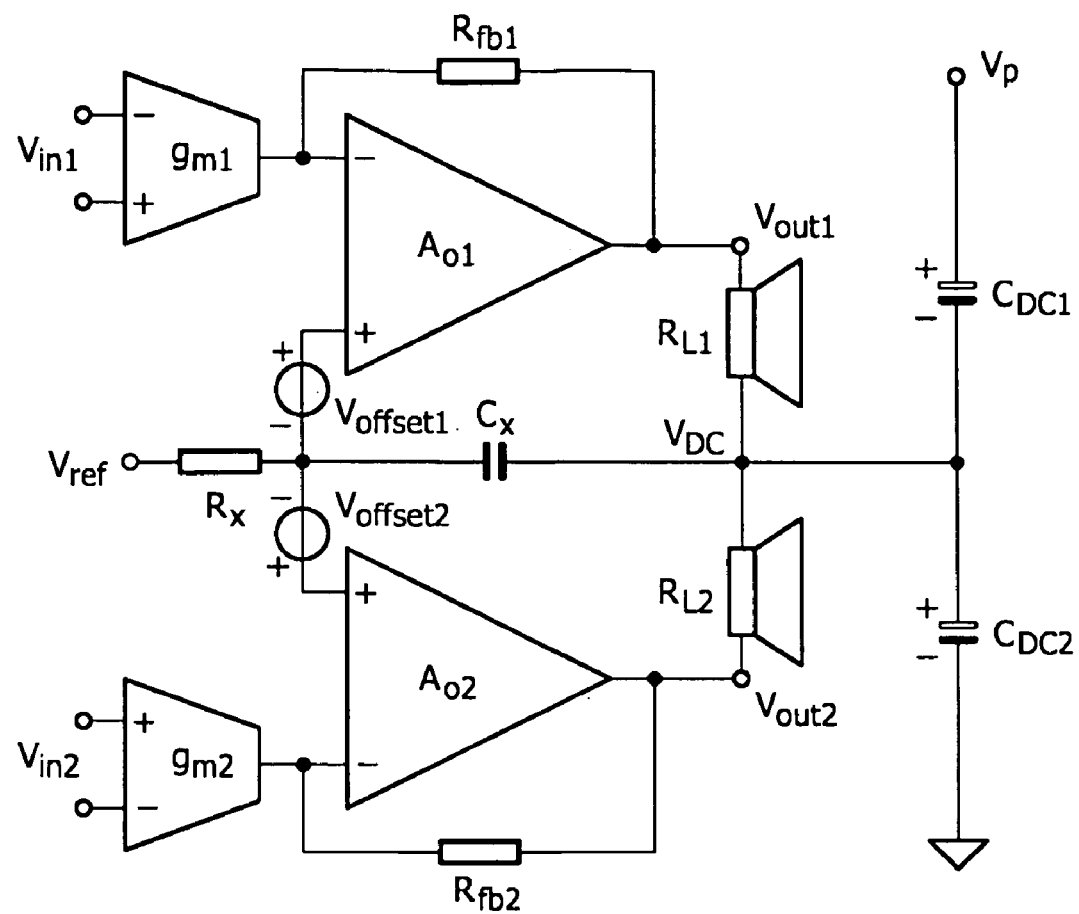
FIG. 3 shows combining DC-blocking with supply decoupling according to a third embodiment of the invention.

In the stereo configuration embodiment of FIG. 3, two DC-blocking capacitors $C_{DC1}$ and $C_{DC2}$ are used: one connected to ground and one connected to a supply $V_p$. In this case the DC-blocking capacitors also serve as supply decoupling capacitors.

It should be noted that the above-mentioned embodiments illustrate rather than limit the invention, and that those skilled in the art will be able to design many alternative embodiments without departing from the scope of the appended claims. While the embodiments show an audio amplifier having a loudspeaker as load, the invention may be used with amplifiers having other loads. A feedback to a non-inverting input can be replaced by a feedback to an inverting input if the feedback path includes an inverter. The amplifier does not need to be an operational amplifier having both inverting and non-inverting inputs. The amplifier arrangement does not need to comprise a V-I converter followed by a transimpedance amplifier. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. An amplifier arrangement comprising:
   an amplifier having an output,
   a first feedback between the output and a first input of an input side of the amplifier,
   a load having a first terminal coupled to the output, and a second terminal,
   a DC-blocking capacitance between the second terminal of the load and a reference terminal; and
   a second feedback between the second terminal of the load and a second input of the input side of the amplifier;
   wherein the DC-blocking capacitance comprises a first DC-blocking capacitor between the second terminal of the load and a power supply terminal and a second DC-blocking capacitor between the second terminal of the load and ground.

2. A multi-channel amplifier unit, comprising a plurality of amplifier arrangements as claimed in claim 1, wherein the amplifier arrangements share a common DC-blocking capacitance.

3. A multi-channel amplifier unit as claimed in claim 2, wherein the DC-blocking capacitance comprises a first DC-blocking capacitor between the second terminal of the load and a power supply terminal and a second DC-blocking capacitor between the second terminal of the load and ground.

4. A multi-channel amplifier unit, comprising a plurality of amplifier arrangements as claimed in claim 1, wherein the amplifier arrangements share a common second feedback.

5. A multi-channel amplifier unit comprising:
   a plurality of amplifier arrangements, having:
   an amplifier having an output,
   a first feedback between the output and a first input of an input side of the amplifier,
   a load having a first terminal coupled to the output, and a second terminal,
   a DC-blocking capacitance between the second terminal of the load and a reference terminal; and
   a second feedback between the second terminal of the load and a second input of the input side of the amplifier;
   wherein the amplifier arrangements share a common DC-blocking capacitance.

6. A multi-channel amplifier unit as claimed in claim 5, wherein the DC-blocking capacitance comprises a first DC-blocking capacitor between the second terminal of the load and a power supply terminal and a second DC-blocking capacitor between the second terminal of the load and ground.

7. A multi-channel amplifier unit comprising:
   a plurality of amplifier arrangements having:
   an amplifier having an output,
   a first feedback between the output and a first input of an input side of the amplifier,
   a load having a first terminal coupled to the output, and a second terminal,
   a DC-blocking capacitance between the second terminal of the load and a reference terminal; and
   a second feedback between the second terminal of the load and a second input of the input side of the amplifier;
   wherein the amplifier arrangements share a common second feedback.

* * * * *